(12) United States Patent
Lee et al.

(10) Patent No.: US 7,701,552 B2
(45) Date of Patent: Apr. 20, 2010

(54) EXPOSURE DEVICE

(75) Inventors: Duk Lee, Machida (JP); Daisuke Yamashita, Machida (JP); Masaaki Matsuda, Machida (JP); Jun Ishikawa, Machida (JP)

(73) Assignee: ORC Manufacturing Co., Ltd., Tokyo (JP)

( * ) Notice: Subject to any disclaimer, the term of this patent is extended or adjusted under 35 U.S.C. 154(b) by 191 days.

(21) Appl. No.: 12/079,502

(22) Filed: Mar. 27, 2008

(65) Prior Publication Data
US 2009/0039292 A1  Feb. 12, 2009

(30) Foreign Application Priority Data
Mar. 28, 2007  (JP)  ............... 2007-083869

(51) Int. Cl.
G03B 27/42 (2006.01)
(52) U.S. Cl. .......................... 355/53; 355/55
(58) Field of Classification Search ............ 355/53, 355/55
See application file for complete search history.

(56) References Cited

U.S. PATENT DOCUMENTS 5,526,147 A * 6/1996 Omae et al. ............ 349/8

FOREIGN PATENT DOCUMENTS

| JP | 2006-113413 | 4/2006 |
|----|-------------|--------|
| JP | 2006-337475 | 12/2006 |
| JP | 2006-343684 | 12/2006 |

* cited by examiner

Primary Examiner—Kiet T Nguyen
(74) Attorney, Agent, or Firm—Dilworth & Barrese LLP

(57) ABSTRACT

The present invention presents an exposure device, which includes an optical source for emitting a UV ray, a first lighting system for shaping the UV ray into a collimated light beam, an aperture member for producing rectangular first and second light beams based on the light beam from first lighting system by using the first and second rectangular windows, first and second spatial light modulators for spatially modulating the first and second light beams, respectively, and first and second projection lighting systems for guiding the modulated first and second light beams to the object.

20 Claims, 12 Drawing Sheets

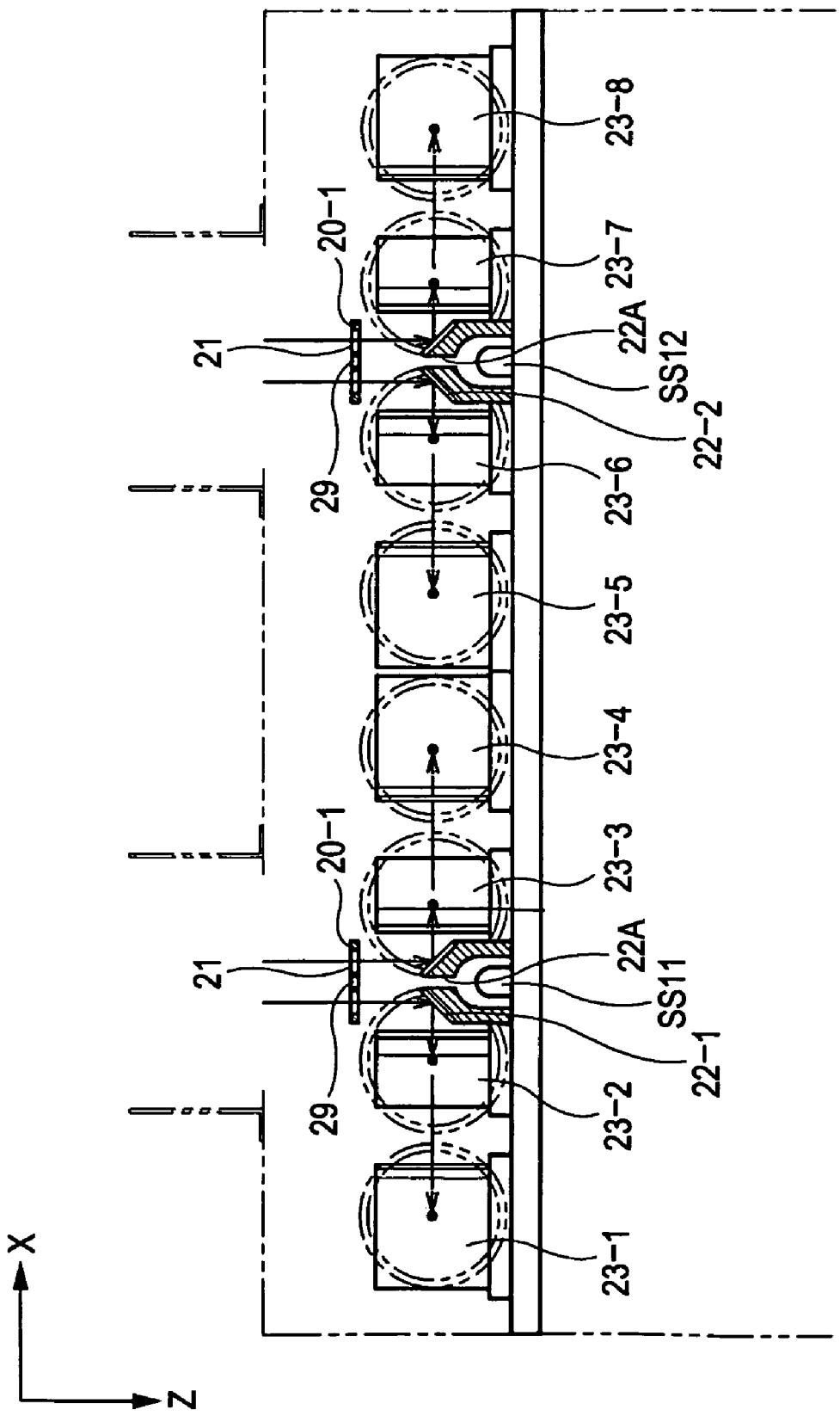

EXPOSURE DEVICE

CROSS-REFERENCE TO RELATED APPLICATIONS

This application claims the benefit of Japanese Patent Application 2007-083869 filed on Mar. 28, 2007, the disclosure of which is incorporated herein by reference.

BACKGROUND OF THE INVENTION

1. Field of the Invention

The present invention relates to an exposure device for forming patterns on a surface of a flat-sheet material, including a substrate for an electronic circuit, a glass substrate for an LCD and a glass element substrate for a PDP.

2. Description of the Related Art

In general, substrates for electronic circuits or printed circuits are applied to portable phones or various types of PCs. On a substrate of this type, multiple fine patterns, lands and via-holes tend to be formed with great precision. In order to follow this trend, an exposure device which is used in an exposure process for forming patterns needs to possess a technique for generating high-intensity and precise-collimated light beams.

A general type, that is, contact or projection type exposure device is required to handle many different types of substrates in a short period. Such an exposure device needs to contain masks to form patterns. Accordingly, multiple different masks are prepared depending on the types of substrates to be processed. However, those masks are hard to prepare, exchange or maintain, thus making it difficult to treat many different substrates efficiently.

Because of this disadvantage, interest is growing in a direct type exposure system and a device incorporating this system. This direct type exposure system transfers patterns from CAD data to a substrate by means of light beams, so that masks are unnecessary (see JP A 2006-113413, JP A 2006-343684 and JP A 2006-337475). However, a typical direct exposure device tends to have a low reaction speed in forming patterns, because its light source is a laser of a short wavelength such as 405 nm. Hence, efficient direct type devices have been highly in demand.

In addition to the inefficient exposure operation as described above, a typical direct exposure device involves a cost increase. This is because it is equipped with many spatial light modulation elements for treating large-size substrates. If high-intensity light beams are irradiated to those many spatial light modulation elements, then many light sources are required, thus leading to the increase in the material costs. The direct type exposure device of JP A 2006-343684 or JP A 2006-337475 is designed to address this disadvantage. Specifically, this device has seven low-illumination UV lamps and optical fibers. The light beams outputted from the lamps are concentrated by the optical fibers, and are incident to one or more optical systems. However, those devices fail to teach or suggest a technique for controlling the light beams in accordance with the photosensitive property of an object to be processed.

Taking the above description into account, the present invention has been conceived. An object of the present invention is to provide a direct type exposure device which works efficiently. An additional object of the present invention is to present a direct type exposure device which has a few optical sources and many digital micro-mirror devices (DMDs) functioning as spatial light modulation devices. A further object of the present invention is to produce a direct type exposure device which is designed to monitor the intensity of its light sources and the operation of its spatial light modulation devices and to control them based on the monitoring result.

SUMMARY OF THE INVENTION

According to a first aspect of the present invention, there is provided, an exposure device for forming predetermined patterns onto an object, comprising:
a1) an optical source for emitting a UV ray;
a2) a first lighting system for shaping the UV ray into a collimated light beam;
a3) an aperture member having first and second rectangular windows, the aperture member for producing rectangular first and second light beams based on the light beam from first lighting system by using the first and second rectangular windows;
a4) first and second spatial light modulators for spatially modulating the first and second light beams, respectively; and
a5) first and second projection lighting systems for guiding the modulated first and second light beams to the object.

In the exposure device of the first aspect, the single ray emitted from the optical source is split by the aperture member, so that the multiple light beams are produced. Subsequently, those light beams are spatially modulated by the two spatial light modulators. As a result, the multiple light beams are irradiated to the object at the same time. This makes it possible to enhance the operational efficiency of the exposure device.

According to a second aspect of the present invention, there is provided, the exposure device according to the first aspect, further comprising:
b1) a plurality of reflective optical elements for totally reflecting the first and second light beams that have been produced by the aperture member, thereby directing both light beams toward the first and second spatial light modulators, respectively; and
b2) a plurality of second lighting systems for guiding the first and second light beams reflected by the reflective optical elements to the first and second spatial light modulators, respectively, the second lighting systems having different optical paths. Further, the first and second projection lighting systems are arrayed.

In the exposure device of the second aspect, the first and second light beams are guided to the first and second spatial light modulators through the optical paths of different lengths, respectively. This enables the first and second projection lighting system to be arranged in line. Therefore, this structure can easily be assembled and maintained.

According to a third aspect of the present invention, there is provided, the exposure device according to the second aspect, further comprising one or more total reflection mirrors that are placed between the aperture member and the first and the second spatial light modulators.

In general, a light beam is guided by an optical fiber. However, if an optical fiber is used, then a light beam tends to be dispersed and attenuated. In contrast, in the exposure device of the third aspect, the light beams are guided by the small number of the total reflection mirrors to the first and second spatial light modulators. In other words, the light beams are guided with subjected to minimum attenuation.

According to a fourth aspect of the present invention, there is provided, the exposure device according to the second aspect, in which each of the second lighting systems comprises an iris adjuster having a variable opening window, and the iris adjuster changes size of the opening window, thereby adjusting intensity of the light beam incident thereon. In addition, the iris adjuster has a heatsink member.

In the exposure device of the fourth aspect, if the first and second light beams that have been split by the aperture member are different in intensity, the iris adjuster adjusts this difference. In addition, since the iris adjuster is likely to be heated by the light beam, it has a heatsink member for preventing the excessive temperature rise.

According to a fifth aspect of the present invention, there is provided, the exposure device according to one of the second to fourth aspects, further comprising:

c1) a plurality of nozzles for blowing coolant gas to the aperture member and the first and second spatial light modulators, separately.

With theses nozzles, the excessive temperature rise of the aperture member and the first and second spatial light modulators can be prevented, thereby ensuring the stable operation of the exposure device.

According to a sixth aspect of the present invention, there is provided, the exposure device according to the first aspect, in which the aperture member further has third and fourth rectangular windows, the aperture member for further producing third and fourth light beams based on the ray from the first lighting system by using the third and fourth rectangular windows. In addition, the exposure device further comprises third and fourth spatial light modulators for spatially modulating the third and fourth light beams produced by the aperture member, respectively. Further, the first, second third and fourth rectangular windows of the aperture member are positioned at 45, 135, 225 and 315 degree, respectively with respect to a line of one of the rectangular windows.

In the exposure device, because the ray from the optical source is reflected by an elliptic mirror, the cross section of the reflected ray is circular. Accordingly, in terms of efficient use of the light beams, the cross section of the light beam is preferably rectangular in shape. Hence, the circular ray is converted into the four rectangular light beams by the four rectangular windows of the aperture member. Moreover, it is preferable that the four rectangular windows are positioned at 45, 135, 225 and 315 degree, respectively with respect to a line of one of the rectangular windows.

According to a seventh aspect of the present invention, there is provided, the exposure device according to the fifth aspect, in which each of the nozzles has a valve for adjusting an amount of the coolant gas. Furthermore, the exposure device further comprises:

d1) a plurality of temperature sensors being arranged corresponding to the aperture member and the first and second spatial light modulators, respectively, the temperature sensors for detecting temperatures thereof, and d2) a valve controller for controlling the valve of each of the nozzles, based on the detected temperatures.

The exposure device of the seventh aspect continuously detects and monitors the temperatures of the aperture member and the first and second spatial light modulators. If the detected result is close to the upper limit, the valve controller opens the valve, thus discharging the large-volume coolant gas to the heated member. Consequently, it is possible to prevent the failure of the member(s) due to excessive heat, thereby ensuring the stable operation of the exposure device.

According to an eighth aspect of the present invention, there is provided, the exposure device according to one of the first to seventh aspects, further comprising:

e1) an optical filter in the first lighting system, a passing wavelength range of which is variable.

With the exposure device of the eighth aspect, an exposure process is executed by using exposure light of an appropriate wavelength range.

According to a ninth aspect of the present invention, there is provided, an exposure device for forming predetermined patterns onto an object, comprising:

f1) first and second optical sources for emitting UV rays;

f2) first and second lighting systems for shaping the UV rays from the first and second light sources into collimated light beams, respectively;

f3) a first aperture member having four rectangular windows, the first aperture member for splitting the light beam from the first lighting system into four light beams by using the rectangular windows;

f4) a second aperture member having four rectangular windows, the second aperture member for splitting the light beam from the second lighting system into four light beams by using the rectangular windows;

f5) first to fourth spatial light modulators for spatially modulating the four light beams split by the first aperture member, respectively;

f6) fifth to eighth spatial light modulators for spatially modulating the four light beams split by the second aperture member, respectively;

f7) first to eighth projection lighting systems for guiding the light beams modulated by the first to eighth spatial light modulators to the object, respectively; and f8) a substrate stage on which the object is to be placed, the substrate stage for moving the object in predetermined directions, wherein the object is positioned at focal points of the first to eighth projection lighting systems.

The exposure device of the ninth aspect has ability to give an exposure process to the whole surface of a large object such as a large printed circuit board merely at one or two steps. In other words, this device has an improved production capacity.

As described above, the exposure device of the present invention is configured to convert the UV ray from the optical source into a collimated light beam, and then, to equally split the beam into the four. Following this, the four beams are delivered to the spatial light modulators. In this exposure device, the aperture members are prevented from being deformed due to temperature rise, whereby the shapes of the light beams are nearly identical. Furthermore, the light beams are incident on the temperature-controlled optical members. As a result, it is possible for the exposure device of the present invention to create fine patterns on an object precisely.

BRIEF DESCRIPTION OF THE DRAWINGS

For more complete understanding of the present invention and the advantages hereof, reference is now made to the following description taken in conjunction with the accompanying drawings wherein:

FIG. 5 is a schematic view depicting reflective optical elements 22-1 and 22-2 and total reflection mirrors 23-1 to 23-8 of the exposure device 10 as seen on a Y axis;

DETAILED DESCRIPTION OF THE EXEMPLARY EMBODIMENTS OF THE INVENTION

<Whole Structure of Exposure Device>

Figure 1:
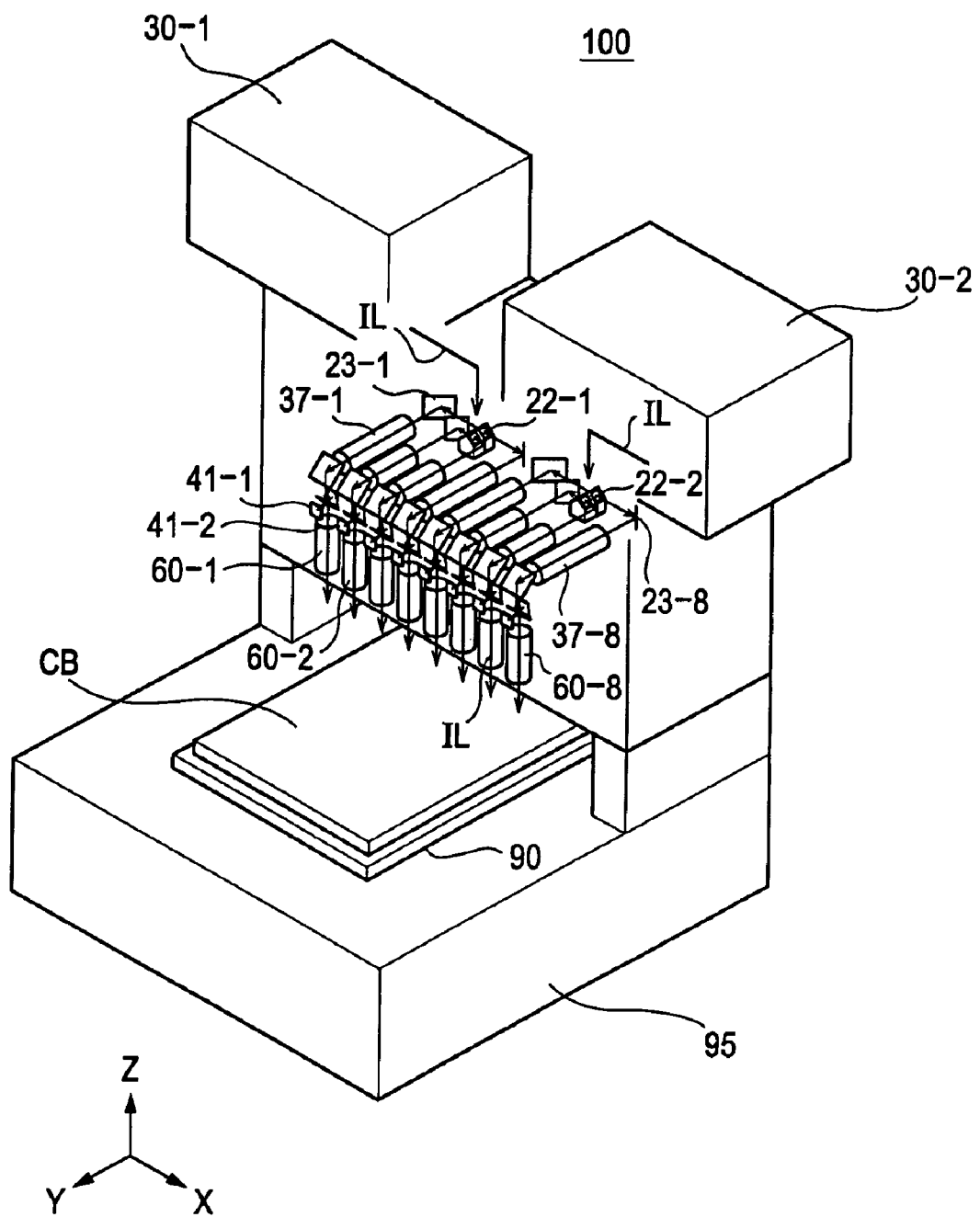
FIG. 1 is a schematically perspective view depicting an exposure device 100 according to one embodiment of the present invention.

FIG. 1 schematically shows an exposure device 100 according to an embodiment of the present invention. This exposure device 100 mainly includes first lighting systems 30-1 and 30-2, second lighting systems 37-1 to 37-8, spatial light modulation systems (thereinafter referred to as "DMDs") 41-1 to 41-8, projection optical systems 60-1 to 60-8, and an object table 90. The reason why the two first lighting systems (30-1 and 30-2) are used is to irradiate an object CB widely. These first lighting systems 30-1 and 30-2 contain a first high-pressure mercury lamp 10-1 and a second high-pressure mercury lamp 10-2 (see FIG. 2), respectively.

Figure 2:
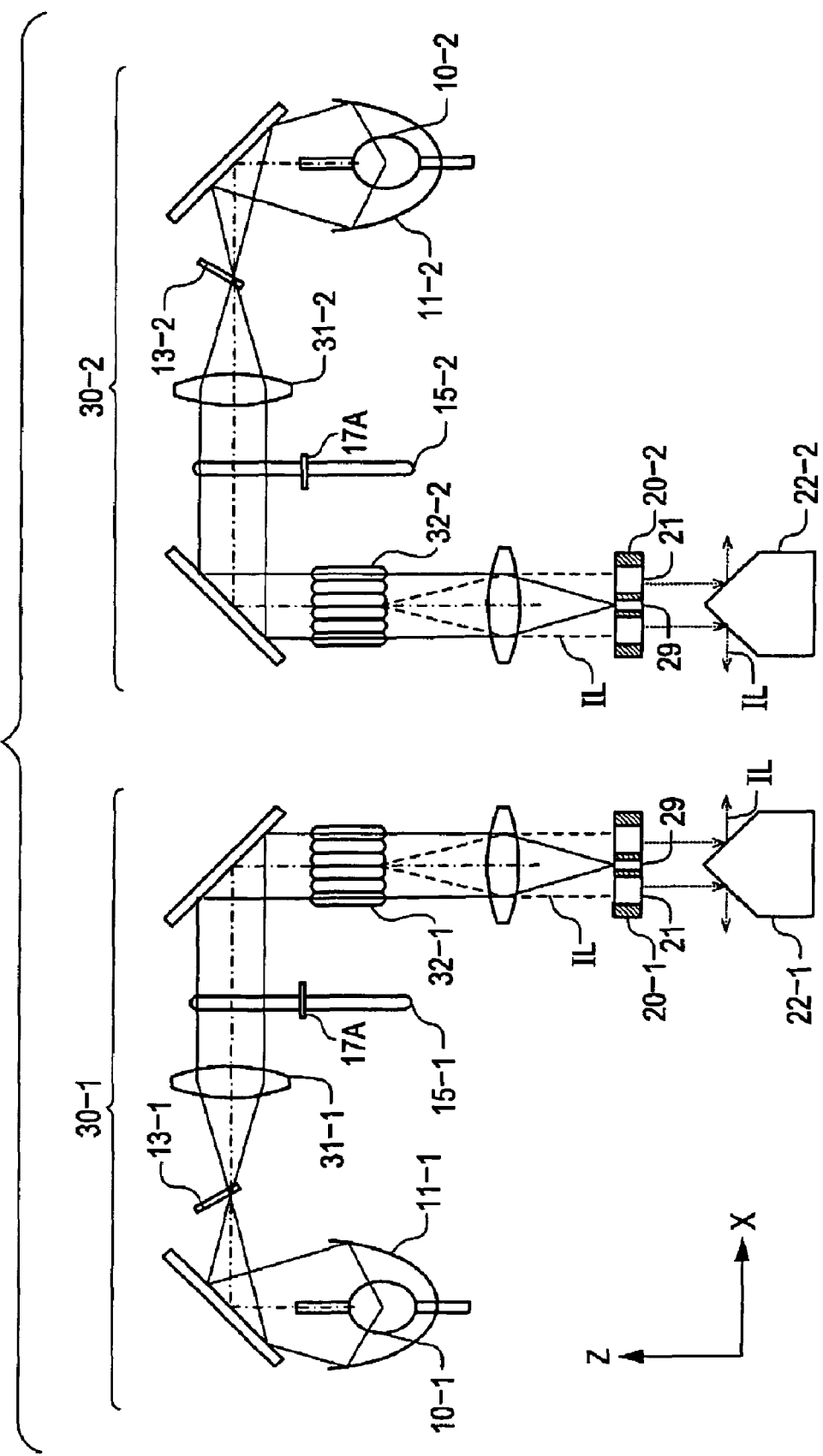
FIG. 2 is a schematic view depicting first lighting systems 30-1 and 30-2 of the exposure device 100.

FIG. 2 schematically shows the first lighting systems 30-1 and 30-2. Since both lighting systems have the identical structure, only the first lighting system 30-1 will be described below.

In this drawing, the first high-pressure mercury lamp 10-1 is located at a primary focal point of an elliptic mirror 11-1. The elliptic mirror 11-1 reflects efficiently the UV light emitted from the first high-pressure mercury lamp 10-1 toward a secondary focal point of an elliptic mirror 11-1. In this embodiment, the first high-pressure mercury lamp 10-1 is used, but the optical source is not limited to it in this invention. Alternatively, a xenon or flash lamp may be utilized.

This first high-pressure mercury lamp 10-1 is designed to constantly emit a light beam IL while being supplied with electric power through a power supply controller (not shown). In this way, the intensity of the light beam IL is made stable. A shutter 13-1 is placed at the secondary focal point of the elliptic mirror 11-1 and blocks off the light beam IL when the device 100 does not need to irradiate the object CB. The light beam IL from the first high-pressure mercury lamp 10-1 concentrates at the secondary focal point. Accordingly, the shutter 13-1 is positioned at the secondary focal point, so that it does not have to move greatly to block off the light beam IL.

The first lighting system 30-1 includes a collimator lens 31-1 and a fly-eye lens 32-1, and they shape the light beam IL into a beam of a uniform density. The light beam IL diverges from a point image at the secondary focal point, and is then incident to the collimator lens 31-1. This incident light beam is converted into a collimated beam, and is then inputted to a wavelength selection filter 15-1.

The wavelength selection filter 15-1 is composed of a combination of several filter elements. This combination is determined depending on the photoresist coated on the object. The light beam IL that has passed through the wavelength selection filter 15-1 has a desired wavelength range, and this beam is incident on the fly-eye lens 32-1 in order to make its density uniform.

Next, the light beam IL enters an aperture member 20-1 provided with four opening windows 21 and a detection window 29 for sensing light intensity. The light beam IL is inputted to the aperture member 20-1 in parallel with the Z axis, that is, perpendicularly to the incident surface of the aperture member 20-1. The light beam IL that has passed through the aperture member 20-1 is split into four beams IL. Finally, the beams IL1 to IL4 are reflected by a reflective optical element 22-1 composed of total reflection mirrors or a prism, and the reflected beams then travel laterally.

Referring to FIG. 1 again, the eight light beams IL (formed by the aperture members 20-1 and 20-2 and the reflective optical elements 22-1 and 22-2) are reflected by a corresponding one of the total reflection mirrors 23-1 to 23-8, and they then travel in parallel with the Y axis. Subsequently, the eight light beams IL are incident to a corresponding one of the second lighting systems 37-1 and 37-8.

The light beams IL are subjected to a beam shaping in the second lighting systems 37-1 to 37-8, so that they each have a predetermined shape and preset intensity. Following this, the light beams IL are thrown to eight arrayed DMDs 41-1 to 41-8. The DMDs 41-1 to 41-8 spatially modulate the light beams IL based on an input image data. The light beams IL modulated by the DMDs 41-1 to 41-8 pass through the projection optical systems 60-1 and 60-8, respectively, so that each beam has a predetermined magnification. Finally, the light beams IL are irradiated to the object CB.

The projection optical systems 60-1 to 60-8 precisely adjust the magnifications of the light beams IL. As a result, the identical eight irradiated areas are created on the object. Moreover, the magnifications may be varied depending on the size of the object CB. The exposure device 100 has the eight projection optical systems 60-1 to 60-8 which are arrayed on the X axis.

Note that those DMDs 41-1 to 41-8 and the projection optical systems 60-1 to 60-8 are easy to fabricate and maintain.

The exposure device 100 includes a base 95 under the projection optical systems 60-1 to 60-8 with respect to the Z axis, and it supports the first lighting systems 30-1 and 30-2, the second lighting systems 37-1 to 37-8 and the projection optical systems 60-1 and 60-8. The base 95 has a pair of guide rails, and an object table 90 is mounted on the guide rails. This object table 90 is driven by a mechanism (not shown) composed of, for example, a ball screw and a stepping motor. With this mechanism, the object table 90 is moved on the guide rails lengthwise or in parallel with the Y axis relative to the projection optical systems 60-1 to 60-8. On the object table 90, a photoresist-coated substrate is set as the object CB. This object CB is fixed onto the object table 90 by means of negative pressure. In the case where the projection optical system 60-1 to 60-8 cannot irradiate the whole lateral surface area of the object CB, then the object table 90 moves in parallel with the X axis. The object table 90 is configured to move on the X axis, as well as on the Z axis in order to be placed at the focal points of the projection optical systems 60-1 to 60-8.

<Wavelength Selection Filter>

Figure 3:
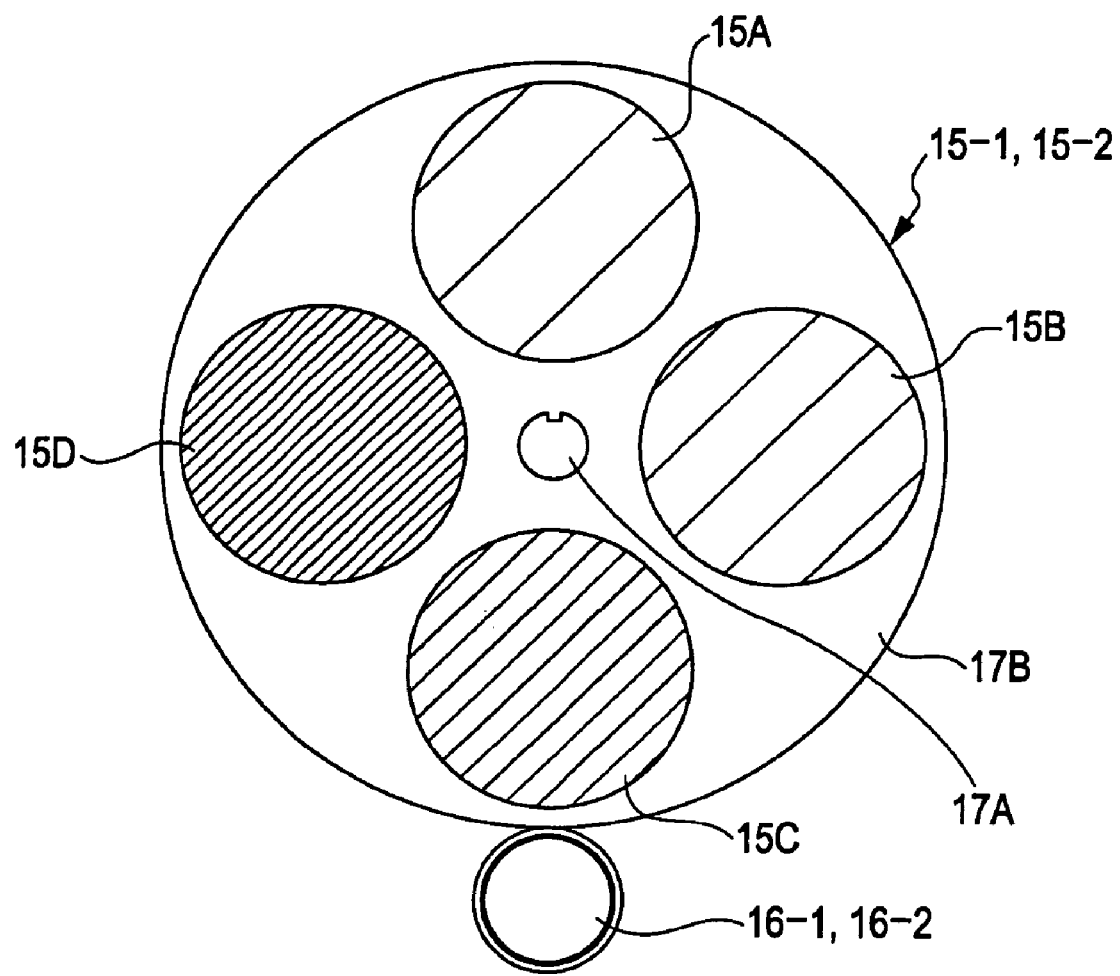
FIG. 3 is a schematic view depicting a wavelength selection filter of the exposure device 100.

Referring to FIG. 3, each of the wavelength selection filters 15-1 and 15-2 includes a rotatable shaft 17A and a frame plate 17B. Further, a drive motor 16-1 or 16-2 keeps in contact with the edge of the frame plate 17B. The wavelength selection filters 15-1 and 15-2 are rotated by the rotation of the drive motors 16-1 and 16-2, respectively.

Examples of the optical filters in the frame plate 17B are as follows.

1) g, h and i-lines filter 15A that cuts off light of 350 nm or shorter and of 450 nm or longer,
2) an i-line filter 15B that cuts off light of 350 nm or shorter and of 380 nm or longer,
3) an h-line filter 15C that cuts off light of 390 nm or shorter and of 420 nm or longer, and
4) a g-line filter 15D that cuts off light of 420 nm or shorter and 450 nm or longer.

The frame plate 17B rotates so as to cut off light of a predetermined wavelength range in accordance with the type of photo-lithography. If considerably intense light enters the wavelength selection filters 15-1 or 15-2, then the frame plate 17B may include a neutral density (ND) filter. If the multiple wavelength selection filters as described above are prepared on the optical axis, then different filters, such as the ND filter and the i-line filter, can be used in combination. The wavelength selection filter 15-1 or 15-2 of FIG. 3 is configured to rotate such that the passing wavelength of light is selected. However, the present invention is not limited to this structure. Alternatively, the wavelength selection filter 15-1 or 15-2 may be configured to go into or escape from the light beam. In addition, the wavelength selection filter 15-1 or 15-2 may be operated manually.

Figure 4:
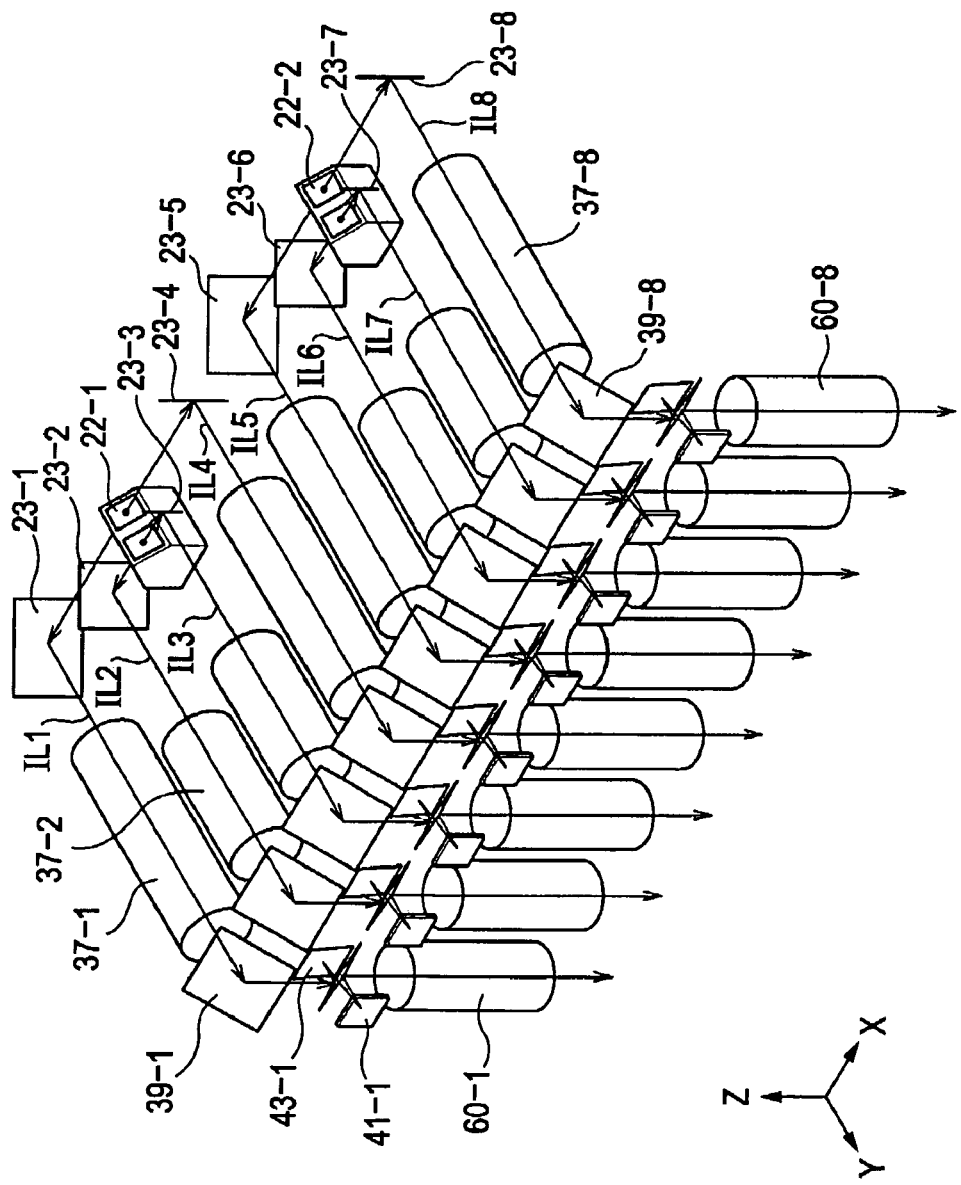
FIG. 4 is a schematic view depicting second lighting systems 37-1 to 37-8, DMDs 41-1 to 41-8 and projection optical systems 60-1 to 60-8 of the exposure device 100.

FIG. 4 shows the second lighting systems 37-1 to 37-8, the DMDs 41-1 to 41-8 and the projection optical systems 60-1 to 60-8. FIG. 5 shows the reflective optical elements 22-1 and 22-2 and the total reflection mirrors 23-1 to 23-8 as seen on the Y axis.

After passing through the aperture members 20-1 and 20-2, the eight light beams IL travel in parallel with the Z axis. Then, the light beams IL are reflected by a corresponding one of the reflective optical elements 22-1 and 22-2 that are constituted by flat mirrors or prisms. The reflected light beams IL travel in parallel with the X axis. Specifically, the four light beams IL that have been formed by the aperture member 20-1 are reflected by the reflective optical element 22-1. Subsequently, those four beams travel along paths IL1, IL2, IL3 and IL4 in parallel with the X axis, respectively. Likewise, the other four light beams IL, which are formed by the aperture member 20-2, are reflected by the reflective optical element 22-2 and, then travel along light paths IL5, IL6, IL7 and IL8 in parallel with the X axis, respectively. The eight light beams traveling along the paths IL1 to IL8 are reflected by the total reflection mirror 23-1 to 23-8, and are directed toward the DMDs 41-1 to 41-8 in parallel with the Y axis, respectively. As shown in FIG. 5, each of the reflective optical elements 22-1 and 22-2 has a light-transmitting zone 22A on its center. In this light-transmitting zone 22A, no through-holes or blocks are formed but merely a space is defined.

The light beams IL reflected from the total reflection mirrors 23-1 to 23-8 travels to the DMDs 41-1 to 41-8 through the second lighting systems 37-1 and 37-8, respectively. Each of the second lighting systems 37-1 and 37-8 is constituted by an iris adjuster 35 and other optical components such as lenses.

As shown in FIG. 4, the light paths IL1, IL4, IL5 and IL8 (that extend between the total reflection mirror and the DMDs) have the same length. Also, the length of the light paths IL2, IL3, IL6 and IL7 is equal. However, the length of the light paths IL1, IL4, IL5 or IL8 is different from that of the light paths IL2, IL3, IL6 or IL7. After reflected by the DMDs 41-1 to 41-8, the light beams IL pass through the projection optical systems 60-1 to 60-8, respectively. Finally, they are irradiated to the object CB. Note that the light beams IL must have the same beam shape when irradiated to the object CB. However, unless all the distances between the DMDs 41-1 to 41-8 and the object CB are the same, then the resolution, dimension and other properties of patterns formed on the object CD may differ depending on the light beams IL. In consideration of this fact, the light beams IL that travel along the paths IL1 to IL8 and that have been reflected from the total reflection mirrors 23-1 to 23-8, respectively are corrected to have the same focal length. After the correction, the beams are incident to the DMDs 41-1 to 41-8. Needless to say, if the lengths of the light paths IL1 to IL8 are different from one another in contrast to the configuration of FIG. 4, then all the light beams IL must be corrected individually.

Figure 6A:
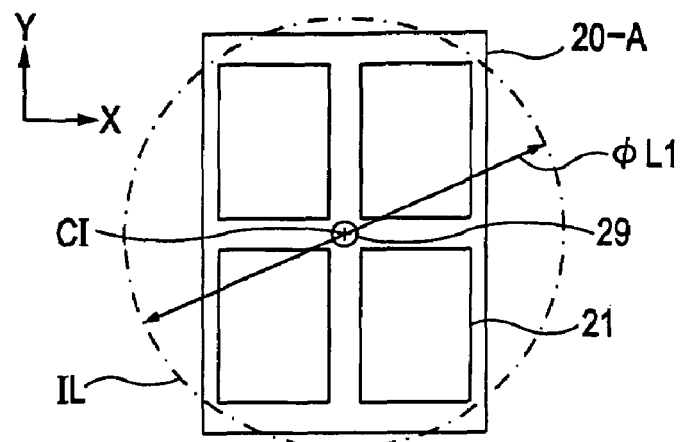
FIG. 6A is a view depicting one example of an aperture member of the exposure device 100.
Figure 6B:
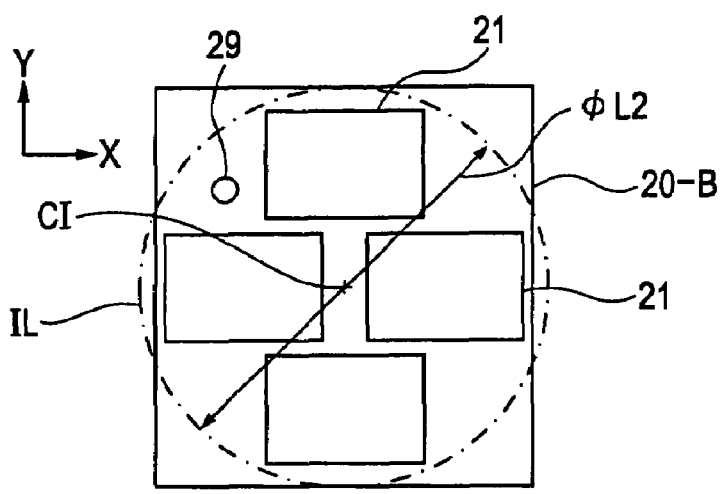
FIG. 6B is a view depicting another example of the aperture member.
Figure 6C:
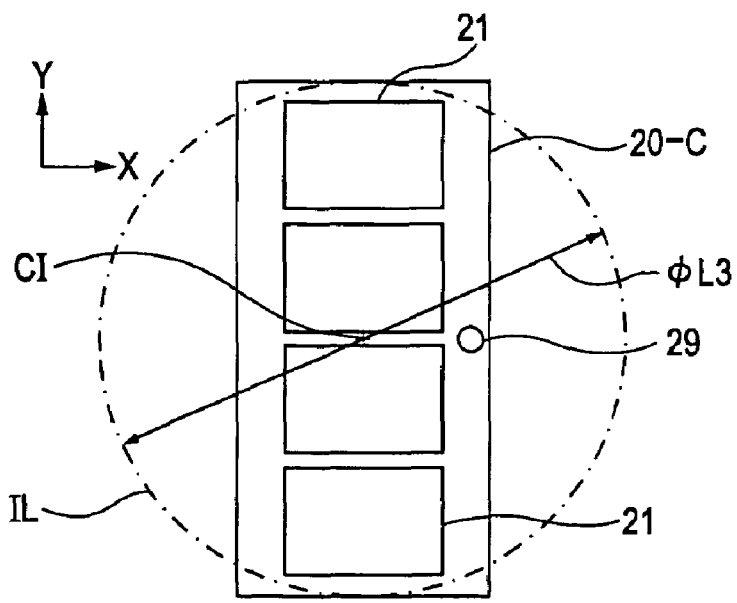
FIG. 6C is a view depicting still another example of the aperture member.

FIGS. 6A to 6C depict any one of the aperture members 20-1 and 20-2. Each of the aperture members 20-1 and 20-2 is made of a material having a low thermal storage property and a low thermal expansion coefficient, such as metal or ceramics. This reason is that since partially exposed to the light beams IL, the aperture members 20-1 and 20-2 tend to be heated. Furthermore, the aperture members 20-1 and 20-2 may be provided with a heat sink in order to decrease the level of the deformation due to the thermal expansion.

The opening windows 21 in each of the aperture members 20-1 and 20-2 are as many as the DMDs 41-1 to 41-8. Each reflective surface of the DMD may be 14 mm by 12 mm in size. The light beam IL irradiated to the DMDs needs to have a rectangular shape in accordance with that of the reflective surface. Furthermore, the light beams IL are required to be as many as the reflective surfaces of the DMDs.

The exposure device 100 is constituted by the two aperture members (20-1 and 20-2), the eight DMDs (41-1 to 41-8) and the four projection optical systems (60-1 to 60-8). Therefore, each of the aperture members 20-1 and 20-2 has four rectangular windows 21 that are placed within the light beam IL drawn by a dashed line in order to split the single light beam IL into four light beams IL, as shown in FIGS. 6A to 6C.

FIGS. 6A to 6C show respective examples of any one of the aperture members 20-1 and 20-2.

Referring to FIG. 6A, an aperture member 20-A has rectangular windows 21 which are arranged at 45, 135, 225 and 315 degree, respectively with respect to a line which is parallel to the X axis and passes through a point CI located at substantially the center of the light beam IL as well as the aperture member 20-A. In other words, the rectangular windows 21 are positioned at 45, 135, 225 and 315 degree, respectively with respect to one line of any of the rectangular windows 21. Furthermore, the aperture member 20-A has a circular detection window at its center. This detection window has a diameter of 3 mm to 5 mm and is used to detect the intensity of the light beam IL. The shape of the detection window 29 is not limited to a circular shape. Alternatively, it may be a rectangular shape. Moreover, the detection window 29 may be provided at any location inside the light beam IL, because the density of the light beam IL is uniform.

Referring to FIG. 6B, an aperture member 20-B has rectangular windows 21 which are arranged at 0, 90, 180 and 270 degree, respectively with respect to a line which is parallel to the X axis and passes through a center CI located at substantially the center of the light beam IL as well as the aperture member 20-B. Moreover, it has the detection window located at 135 degree.

Referring to FIG. 6C, an aperture member 20-C has four rectangular windows 21 arrayed on a line which is parallel to the Y axis and passes through a point CI located at substantially the center of the light beam IL as well as the aperture member 20-C. Furthermore, a detection window 29 is provided away from the Y axis.

The arrangement of the rectangular windows 21 in the aperture member is not limited to that of FIG. 6A, 6B or 6C. However, it needs to be determined based on the number of the DMDs, the size of the reflection surfaces of the DMDs, and a relationship between the pre-split light beam IL and the split light beams IL. The diameter of the light beam IL is related to that of various optical members. Specifically, as the diameter of the light beam IL is smaller, the optical members are downsized, that is, its material cost is on the decrease. It can be found that the diameter L2 of the light beam IL in FIG. 6B is the smallest of the diameters L1, L2 and L3 of the light beam IL in FIGS. 6A, 6B and 6C, respectively. In consideration of this fact, the aperture member 20-B can be the most preferable on the condition that the number of the DMD is four and the reflection surface of each DMD is 14 mm by 12 mm in length.

However, the arrangement of the rectangular windows 21 in the aperture members 20-1 and 20-2 must be determined in view of not only the above fact but also the dimensions of plane mirrors and prisms constituting the reflective optical elements 22-1 and 22-2 and the arrangement of the total reflection mirrors 23-1 to 23-8 located downstream from the aperture members 20-1 and 20-2. Accordingly, taking all the factors into account, the arrangement of FIG. 6A is employed in this embodiment.

In this embodiment, the light beams IL that are outputted from the aperture members 20-1 and 20-2 have the same diameter as those of the light beams IL that are incident on the DMDs 41-1 to 41-8. Therefore, the rectangular window 21 is adapted to have the same size at that of the reflection surface of the DMD. If the second lighting systems 37-1 to 37-8 do not have the magnification of 1:1, then the size of the rectangular window 21 may be different from the reflection surface, depending on the magnification.

<Iris Adjuster>

Figure 7:
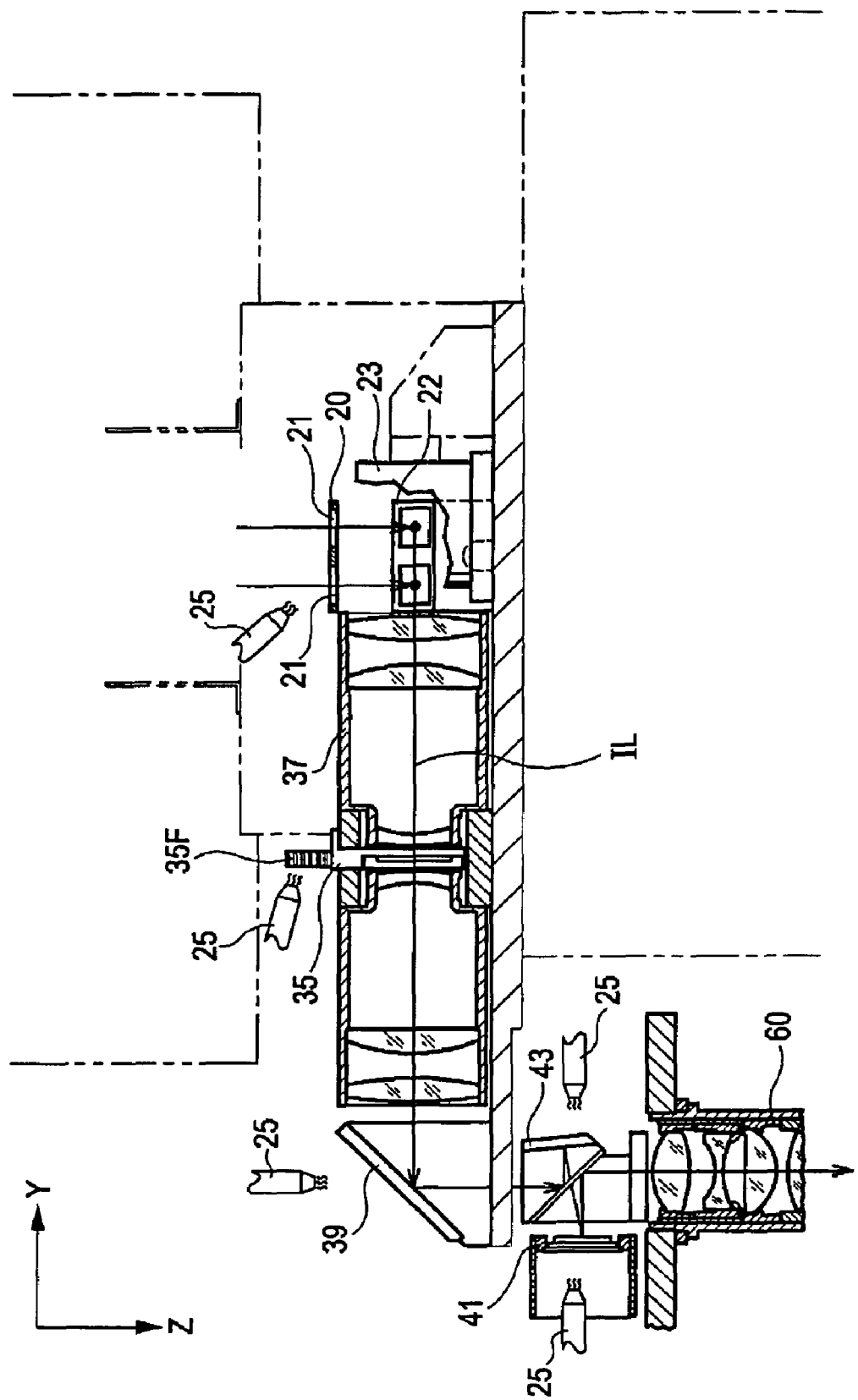
FIG. 7 is a Y-Z cross-sectional view depicting a second lighting system 37 of the exposure device 10.

FIG. 7 shows a cross section of one of the second lighting systems 37-1 to 37-8. In this drawing, a reference numeral 20 indicates an aperture member that represents any one of the aperture members 20-1 and 20-2. Likewise, a reference numeral 23 indicates a total reflection mirror that represents any one of the total reflection mirrors 23-1 to 23-8. A reference numeral 22 indicates a reflective optical element that represents any one of the reflective optical elements 22-1 to 22-2. A reference numeral 37 indicates a second lighting system that represents any one of the second lighting systems 37-1 to 37-8. A reference numeral 39 indicates a mirror that represents any one of mirrors 39-1 to 39-8 (see FIG. 1). A reference numeral 41 indicates a DMD that represents any one of the DMDs 41-1 to 41-8. A reference numeral 43 indicates a reflection prism that represents any one of reflection prisms 43-1 to 43-8 (see FIG. 1). A reference numeral 60 indicates a projection optical system that represents any one of the projection optical systems 60-1 to 60-8.

The light beam IL passes through the aperture member 20 and is then reflected by the reflective optical element 22 and the total reflection mirror 23 in this order. Following this, the light beam IL reaches the DMD 41 through the second lighting system 37 that is constituted by the iris adjuster 35 and other optical components such as lenses.

The iris adjuster 35 is provided with an iris window that is located perpendicular to the optical axis of the light beam IL as shown in FIG. 7. Further, the inner window area of this window is set such that the intensities of all the light beams IL are nearly equal. The size of this window area may be varied by, for example, a motor. Alternatively, it may be fixed and preset based on the measurement result of intensity of the light beam IL.

The iris adjuster 35 receives an approximately quarter of the whole light or heat emitted from the high pressure mercury lamp 10-1 or 10-2. When the iris adjuster 35 slightly closes the iris window to attenuate the light beam IL, the beam impinges on the inner edge of the iris adjuster 35 and heads it. Accordingly, the iris adjuster 35 may have a blade-shaped heat sink 35F for receiving coolant from a cooled nozzle, thereby preventing the excessive temperature rise of the iris adjuster 35 itself. The heat sink 35F may be composed of multiple flat plates.

After passing through the second lighting system 37, the light beam IL is reflected by the mirror 39. Subsequently, the reflected light beam IL travels in parallel to the Z axis, and reaches the reflection prism 43. The reflection prism 43 allows the light beam IL to be curved and directed toward the DMD 41 and, then reflects the light beam IL returned from the micro mirrors M of the DMD 41 toward the projection optical system 60.

<Cooling Nozzle>

Figure 8:
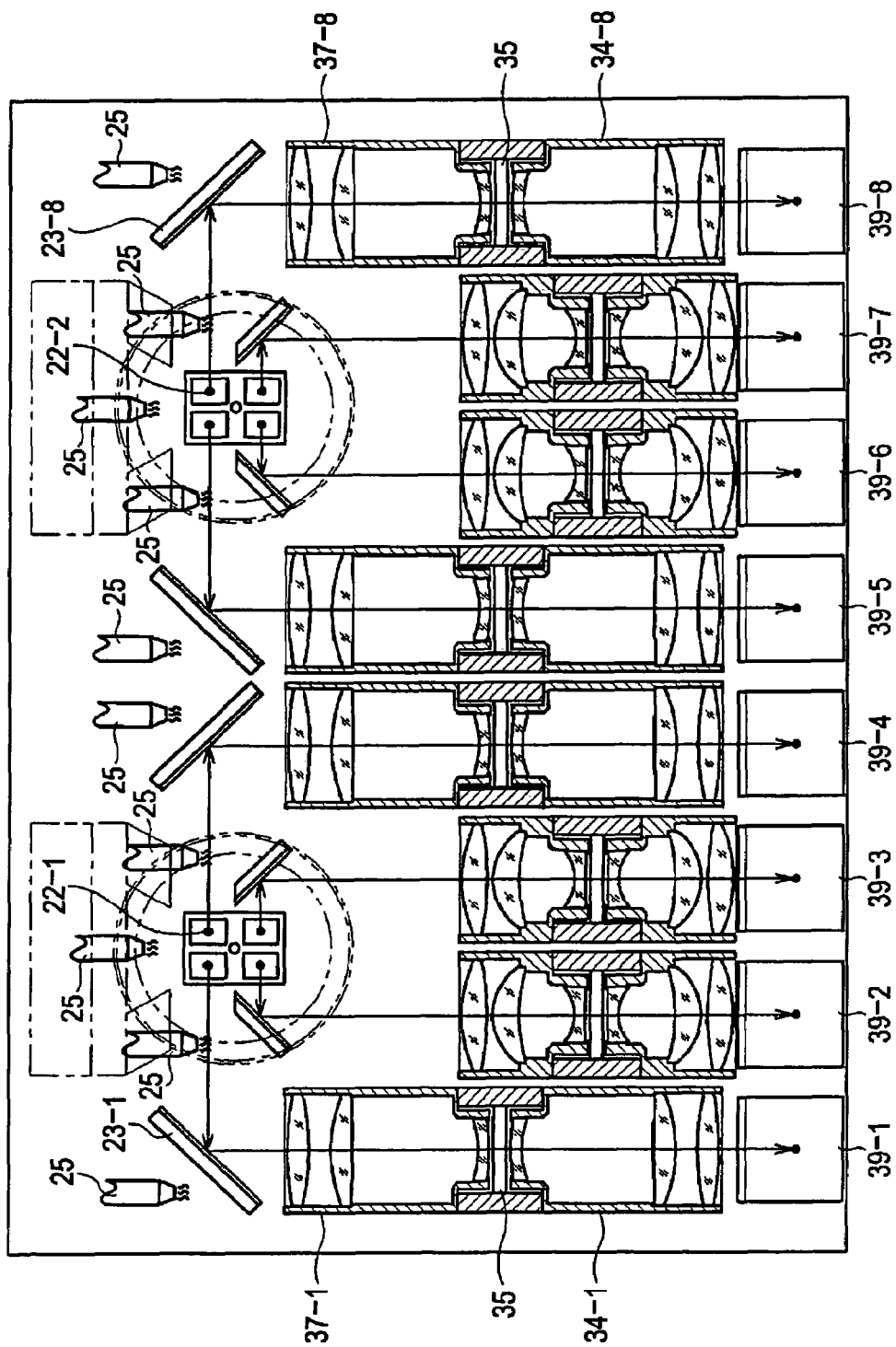
FIG. 8 is an X-Y cross-sectional view depicting the second lighting system 37.

FIG. 8 shows a cross-section of the second lighting systems 37-1 to 37-8 on the X-Y plane.

The exposure device 100 is required to have any member for preventing excessive internal temperature rise, because it contains the high pressure mercury lamps 10-1 and 10-2 that emit high intensity light. Hence, cooling nozzles 25 for spraying coolant gas such as a coolant or compressed air are provided at multiple locations such as electrodes of the high pressure mercury lamps 10-1 and 10-2.

Moreover, the cooling nozzles 25 discharge coolant gas to the aperture members 20-1 and 20-2, as shown in FIGS. 7 and 8. Note that the aperture members 20-1 and 20-2 produce the eight light beams IL, and send them to the DMDs 41-1 to 41-8. Moreover, each have a rectangular shape in accordance with the reflection surface of the DMDs. Therefore, each of the aperture members 20-1 and 20-2 has a large area exposed to the light beam IL. Unless cooled down sufficiently, the aperture members 20-1 and 20-2 may be deformed due to the heat. In this embodiment, the cooling nozzles 25 cool down optical members on the route between the aperture members 20-1 and 20-2 and the DMDs 41-1 to 41-8, including the iris adjusters 35. They also cool down the reflective members on the route. In addition, with the cooling nozzles 25, substance evaporated from the photoresist of the object is prevented from being deposited on the aperture members 20-1 and 20-2 and other optical members. The multiple cooling nozzles 25 are provided on the light paths between the aperture members 20-1 and 20-2 and the DMDs 41-1 to 41-8, and they discharge coolant gas such as compressed air to the surfaces of optical members such as plane lenses and prisms. The DMDs 41-1 to 41-8, each of which drives multiple micro mirrors M based on the preset pattern information, is supported on a board that receives coolant gas from the cooling nozzles 25.

Each of the cooling nozzles 25 is provided with a flow valve 26 so that their flow amounts are adjusted independently of one another. Moreover, temperature sensors TS (see FIG. 9) are attached to the aperture members 21-1 and 21-2, the reflective optical elements 22-1 and 22-2, the iris adjusters 35, the DMDs 41-1 to 41-8, etc. The amount of gas from each cooling nozzle 25 is controlled so that individual optical members are maintained at a predetermined temperature. In terms of the cost, temperature sensors TS should not be attached to all the optical members. However, it is preferable that the temperature sensors TS are attached to the DMDs 41-1 to 41-8, as well as the cooling nozzles 25 equipped with the flow valve 26 are positioned close to the DMDs 41-1 to 41-8. This enables the DMDs to have a long lifetime.

Figure 9:
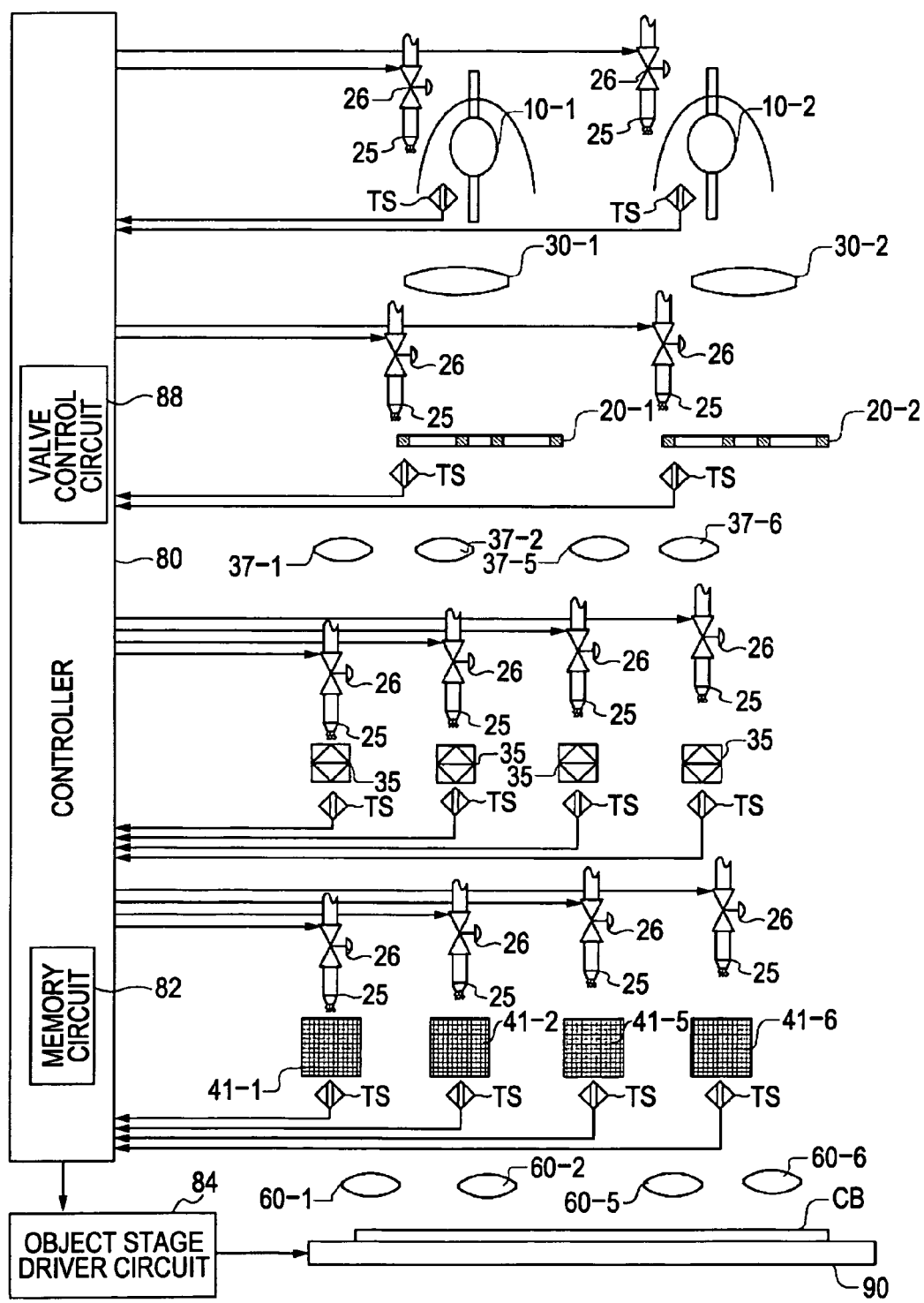
FIG. 9 is a block diagram of a temperature control process using cooling nozzles 25.

FIG. 9 shows a block diagram of a temperature control process executed by using the cooling nozzles 25. Although the number of the routes between the aperture members 20-1 and 20-2 and the projection optical systems 60-1 to 60-8 is eight in this embodiment, this drawing shows only the four routes for simplicity's sake.

Referring to this drawing, the cooling nozzles 25 are placed near the high pressure mercury lamps 10-1 and 10-2, the aperture members 20-1 and 20-2, the iris adjusters 35 and the DMDs 41-1 to 41-8. The cooling nozzle 25 is supplied with coolant gas such as compressed air from a compression pump (not shown). In addition, temperature sensors TS are located near the high pressure mercury lamps 10-1 and 10-2, the aperture members 20-1 and 20-2, the iris adjuster 35 and the DMDs 41-1 to 41-8. The cooling nozzles 25 are provided with the flow valves 26 as described above.

The controller 80 has a memory circuit 82 which stores the temperature upper limits or the temperature ranges that are determined based on locations where the aperture members 20-1 and 20-2, the iris adjusters 35, etc. are placed. The temperature sensors TS detect temperatures at those locations and send the detected results to the controller 80. Upon receipt of the results, the controller 80 determines whether or not the received result (the temperature of the controller 80, the DMDs 41-1 to 41-8, etc.) falls within corresponding predetermined ranges or exceeds corresponding upper limits. Assume that the temperatures of the DMDs 41-1 to 41-8 are determined to be close to their upper limits or the outsides of the rages. In this case, the controller 80 sends the valve control circuit 88 a command for opening the flow valves 26 that are placed near the DMDs 41-1 to 41-8. In response to this command, the valve control circuit 88 opens those flow valves 26. As a result, the amount at which the gas is blown to the DMDs 41-1 to 41-8 increases.

The inner temperature of the exposure device 100 is nearly equal to the room temperature, immediately after power is turned on. In this case, cooling nozzles 25 are not required to blow gas. Hence, the cooling nozzles 25 may be adapted not to operate right after the exposure device 100 is activated. Further, it may start operating after the exposure device 100 initiates the exposure process. Moreover, the controller 80 is also connected to an object stage driver circuit 84, and controls it in such a way that the object table 90 having the object CB thereon moves to a predetermined location.

<DMD>

Figure 10A:
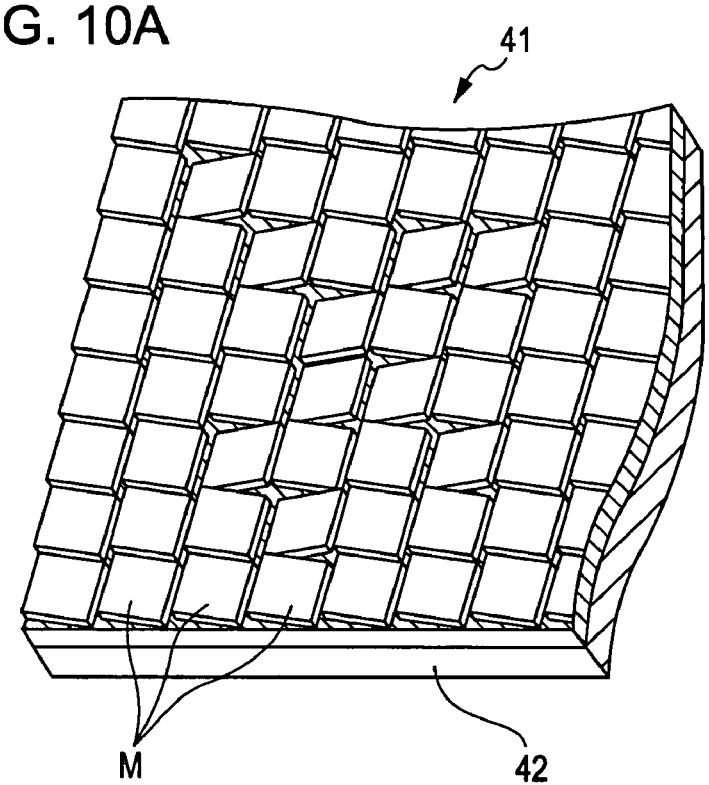
FIG. 10A is a schematic view depicting a DMD 41.
Figure 10B:
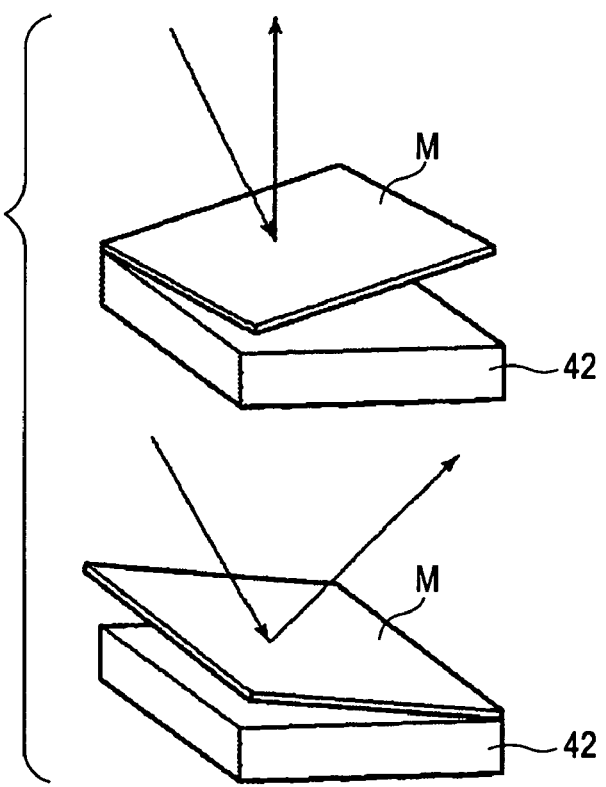
FIG. 10B is a schematic view depicting the operation of the micro mirror M.

FIG. 10A shows the DMD 41 that represents any one of the DMDs 41-1 to 41-8, and FIG. 10B shows the function of the micro mirror M. In this embodiment, the exposure device 100 has the eight DMDs, and its reflection surface is composed of, for example, 1310720 (1024 by 1280) micro mirrors M arranged in a matrix fashion. In the DMD 41, the 1024 micro mirrors M are arrayed on the X side and 1280 micro mirrors Mare arrayed on the Y side. The reflection surface of the DMD 41 is about 12 mm long on the X axis and 14 mm long on the Y axis. Each micro mirror M is about 11.5 square μm long.

The micro mirror M has a high reflection coefficient and is fabricated by subjecting an aluminum sputtering treatment to a wafer 42. The DMD 41 swivels the micro mirrors M by means of static electricity. As shown in FIG. 10B, the micro mirror M can be swiveled around the diagonal lines and have two stable orientations. Once the micro mirror M (m, n) ($1 \leq m \leq 1024$, $1 \leq n \leq 1280$) is positioned facing the object CB, the light beam IL reflected by the DMD 41 travels toward the projection optical system 60. Otherwise, once the micro mirror M (m, n) does not face the projection optical system 60, the light beam travels to a light absorber (not shown), that is, propagates away from the projection optical system 60.

<Operation of Exposure Device>

Next, an operation of the exposure device 100 will be described below with reference to FIGS. 11A to 11C and FIG. 12.

Figure 11B:
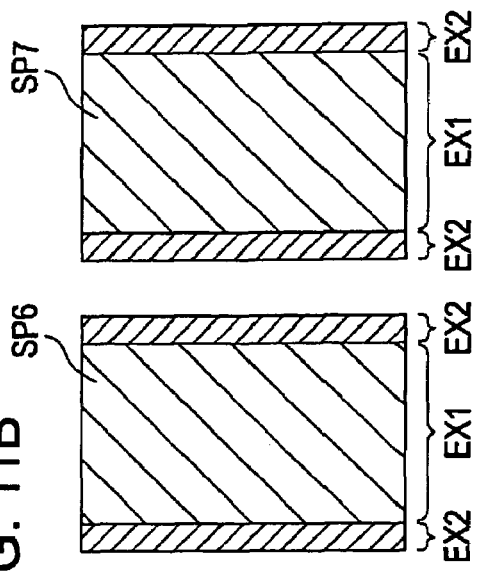
FIG. 11B is a view depicting a stitching operation of the exposure device 100.
Figure 11C:
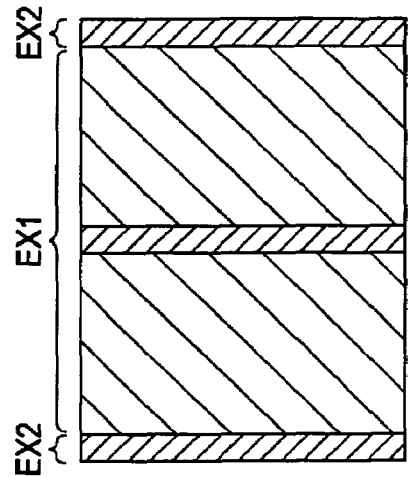
FIG. 11C is another view depicting the stitching operation.
Figure 11A:
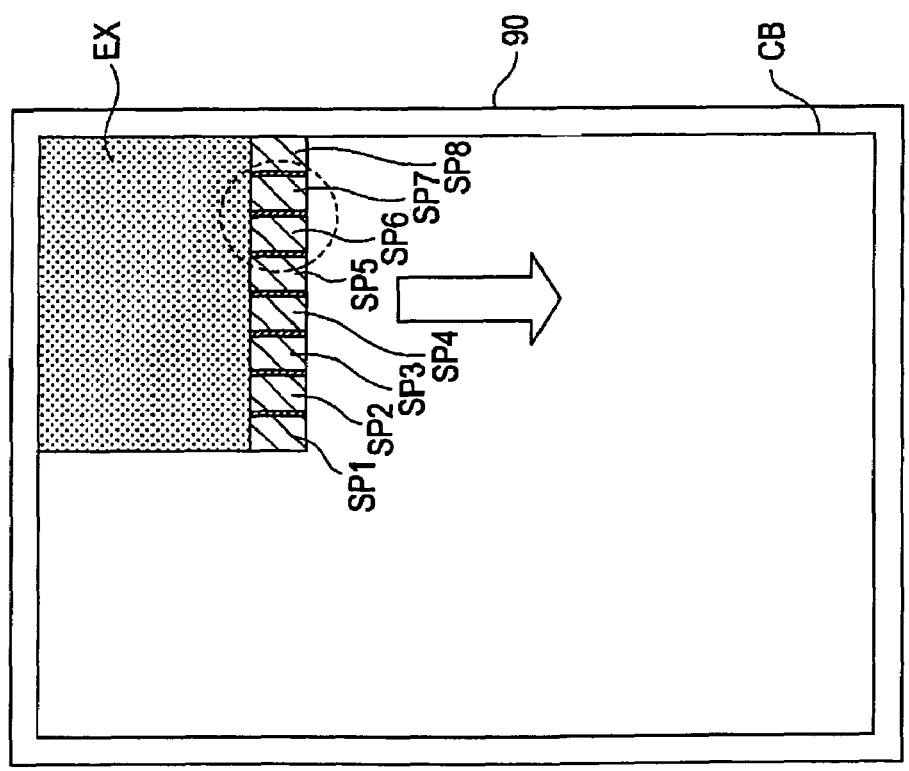
FIG. 11A is a view depicting an exposure process applied to an object CB on an object table 90.
Figure 12:
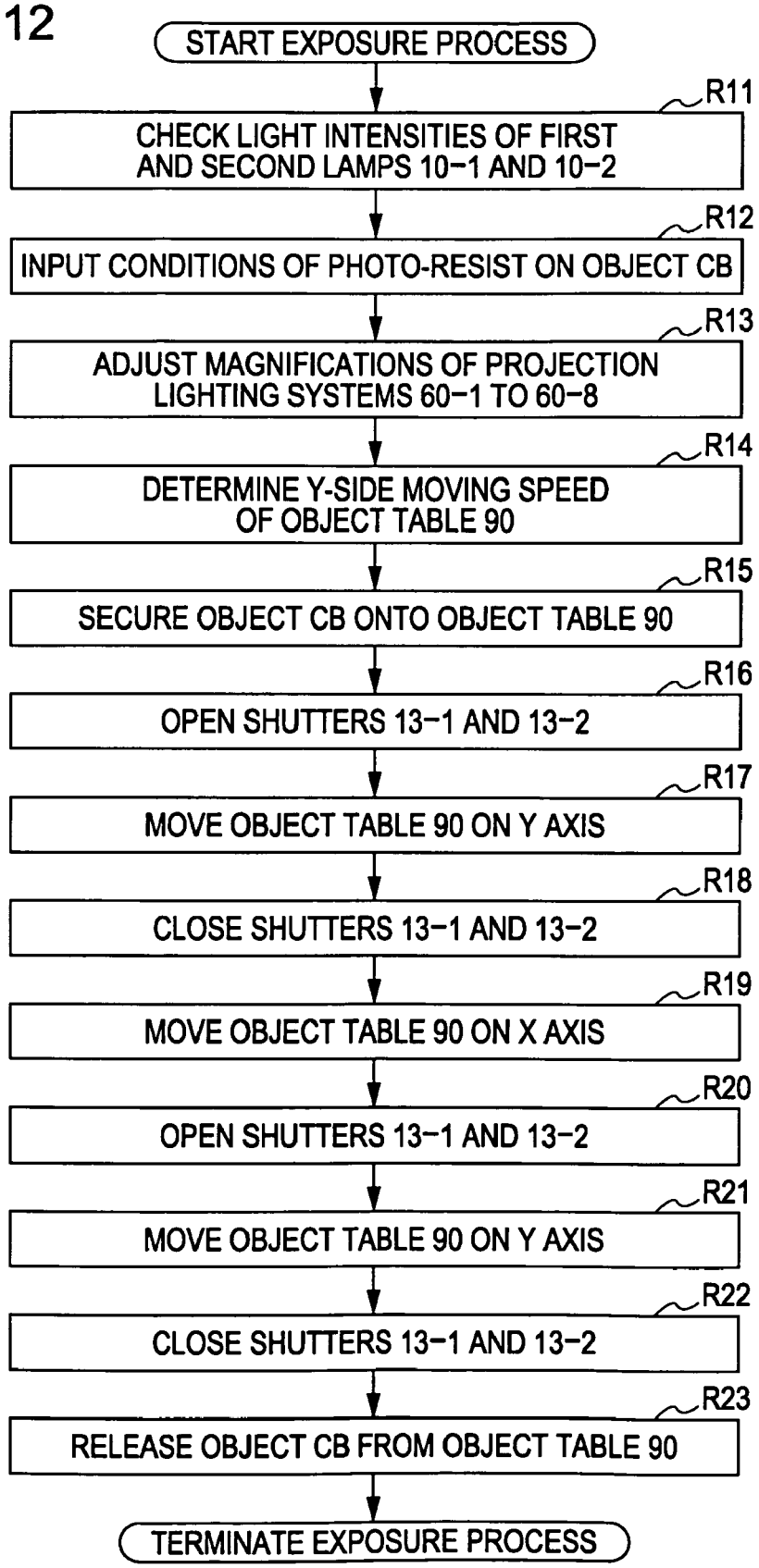
FIG. 12 is a flowchart of the exposure process performed by the exposure device 100.

FIG. 11A depicts the object CB having undergone an exposure process on the object table 90 by the exposure device 100. FIGS. 11B and 11C depict a stitching operation performed by the exposure device 100, and FIG. 12 depicts a flow of the exposure process.

Referring to FIG. 7A, filled rectangular areas SP1 to SP8 represent exposure blocks formed on the X-Y plane (see FIG. 1). In addition, those areas are created by the light beams IL from the projection optical systems 60-1 to 60-8, respectively. Specifically, the exposure blocks SP1 to SP8 arrayed on the X axis are formed by being exposed to the spatially modulated light beams. In addition, while the object table is moving on the Y axis (or in the arrow direction), those exposure blocks, that is, desired patterns are being formed on the whole surface of the object CB. The object CB has a photoresist or a dry film coated on its surface. An exposure region EX consisting of the exposure blocks are extending toward one edge of an object CB as the object table 90 is moving on the Y axis.

Once the exposure blocks SP1 to SP8 reach the edge of the object CB, the shutters 13-1 and 13-2 (see FIG. 2) are closed to block off the light beams IL. Subsequently, the object table 90 moves on the X axis until an unexposed area of the object CB is located directly under the projection optical systems 60-1 to 60-8. Then, after the shutters 13-1 and 13-2 are opened to pass the light beam IL therethrough, new exposure blocks SP1 to SP8 are formed on the non-exposed area of the object CB. As the object table 90 is moving on the Y axis, the exposure region EX is expanding toward the edge of the object CB. In this way, an electric circuit is finally formed on the whole surface of the object CB such as an electronic circuit substrate.

The above process flow will be described below in detail with reference to the flowchart of FIG. 12.

At a step R11, the exposure device 100 checks the light intensities of the first and second high-pressure mercury lamps 10-1 and 10-2 by using the first optical sensors SS11 and SS12, respectively. Based on the checked result, the power supply controller adjusts both light intensities so as to have substantially the same value. After the adjustment is over, the shutters 13-1 and 13-2 block off the light beams IL.

At a step R12, an operator inputs, to the exposure device 100, the conditions of sensibility of the photoresist or the like coated on the object CB.

At a step R13, the exposure device 100 adjusts the magnifications of the projection optical systems 60-1 to 60-8. The object CB is assumed to be 640 mm long on the X side. The exposure device 100 adjusts the magnifications of the projection optical systems 60-1 to 60-8 such that each exposure block is 40 mm long on the X side. In this case, the total length of the exposure blocks SP1 to SP8 is 320 mm. Thus, if the object table 90 shifts in parallel with the X axis once, then the exposure process for the lateral area (640 mm long) of the object CB is finished. Note that this explanation ignores stitching regions (to be described later). In actual cases, the exposure device 100 adjusts the magnifications of the projection optical systems 60-1 to 60-8 such that each exposure block is 40 mm or longer on the X side. Alternatively, the exposure block may be 12 mm or 14 mm long in accordance with the width of the DMD. In this case, the magnification is adjusted to 1:1.

At a step R14, the exposure device 100 determines a speed at which the object table 90 moves in parallel with the Y axis (or in the direction of the arrow of FIG. 7A). Note that this determination is based on the photoresist of the object CB, the light intensities of the first and second high-pressure mercury lamps 10-1 and 10-2 and the magnifications of the projection optical systems 60-1 to 60-8.

At a step R15, the object table 90 sucks the object CB by means of negative pressure, so that the object CB is fixed.

At a step R16, the exposure device 100 opens the shutters 13-1 and 13-2. As a result, patterns are being created on the object CB.

At a step R17, the exposure device 100 moves the object table 90 in parallel with the Y axis.

At a step R18, once the exposure blocks SP1 to SP8 reach an edge of the object CB, the shutters 13-1 and 13-2 block off the light beams IL. At this time, the exposure region EX occupies the half area of the object CB.

At a step R19, the exposure device 100 moves the object table 90 in parallel with the X axis.

At a step R20, the exposure device 100 opens the shutters 13-1 and 13-2, so that the patterns are being created on the object CB again.

At a step R21, the exposure device 100 moves the object table 90 in parallel with the Y axis (or in the direction opposite to the arrow of FIG. 7A).

At a step R22, once the exposure blocks SP1 to SP8 reach the edge of object CB, the shutters 13-1 and 13-2 block off the light beams IL. Now, the exposure region EX occupies the whole area of the object CB.

At the step R23, the object table 90 stops sucking the object CB, and the operator or a transfer machine then removes it from the object table 90.

<Stitching Operation>

Next, the stitching operation will be described below.

In general, the borders between the exposure blocks SP seem to be distinguishing because of the misalignment of the blocks and the difference of intensities of the light beams IL. Hence, the stitching operation is taken place in order to decrease those distinguish levels. In FIG. 11B, the exposure blocks SP6 and SP7 of FIG. 11A are shown enlargedly and separately. Referring to this drawing, full exposure blocks EX1 and half exposure blocks EX2 are defined on the exposure blocks SP6 and SP7.

The full exposure block EX1 of the block SP6 is formed on the condition that the micro mirrors M of the DMD 41-6 are oriented to transmit the full amount of the light beam IL to the object CB in accordance with circuit patterns. In contrast, the half exposure blocks EX2 of the block SP6 are formed on the condition that the micro mirrors M of the DMD 41-6 are oriented to transmit the half amount of the light beam IL to the object CB. In order to create the circuit patterns on the half exposure blocks EX2, the exposure process needs to be repeated there twice. As to the full exposure block EX1 and the half exposure blocks EX2 of the block SP7, the micro mirrors M of the DMD 41-7 also operate in the same way as that of the DMD 41-6. Therefore, if the half exposure block EX2 of the exposure block SP6 overlaps with that of exposure block SP7, then the overlapped blocks turn into the single full exposure block EX1 as shown in FIG. 7C. Note that the half exposure block EX2 of the exposure block SP1 that is formed by a first exposure process is adapted to overlap with that of the exposure block SP8 that is formed by a second exposure process as shown in FIG. 7A.

From the aforementioned explanation, those skilled in the art ascertain the essential characteristics of the present invention and can make the various modifications and variations to the present invention to adapt it to various usages and conditions without departing from the spirit and scope of the claims.

What is claimed is:

1. An exposure device for forming predetermined patterns onto an object, comprising:
    an optical source for emitting a UV ray;
    a first lighting system for shaping the UV ray into a collimated light beam;
    an aperture member having first and second rectangular windows, the aperture member for producing rectangular first and second light beams based on the light beam from first lighting system by using the first and second rectangular windows;
    first and second spatial light modulators for spatially modulating the first and second light beams, respectively; and
    first and second projection lighting systems for guiding the modulated first and second light beams to the object.

2. The exposure device according to claim 1, further comprising:
    a plurality of reflective optical elements for totally reflecting the first and second light beams that have been produced by the aperture member, thereby directing both light beams toward the first and second spatial light modulators, respectively; and
    a plurality of second lighting systems for guiding the first and second light beams reflected by the reflective optical elements to the first and second spatial light modulators, respectively, the second lighting systems having different optical paths,
    wherein the first and second projection lighting systems are arrayed.

3. The exposure device according to claim 2, further comprising one or more total reflection mirrors that are placed between the aperture member and the first and the second spatial light modulators.

4. The exposure device according to claim 3, further comprising a plurality of nozzles for blowing coolant gas to the aperture member and the first and second spatial light modulators, separately.

5. The exposure device according to claim 4, wherein each of the nozzles has a valve for adjusting intensity of the coolant gas,
    the exposure device further comprising:
    a plurality of temperature sensors being arranged corresponding to the aperture member and the first and second spatial light modulators, respectively, the temperature sensors for detecting temperatures thereof, and
    a valve controller for controlling the valve of each of the nozzles, based on the detected temperatures.

6. The exposure device according to claim 2,
    wherein each of the second lighting systems comprises an iris adjuster having a variable opening window, and the iris adjuster changes size of the opening window, thereby adjusting intensity of the light beam incident thereon, and wherein the iris adjuster has a heatsink member.

7. The exposure device according to claim 6, further comprising a plurality of nozzles for blowing coolant gas to the aperture member and the first and second spatial light modulators, separately.

8. The exposure device according to claim 7, wherein each of the nozzles has a valve for adjusting intensity of the coolant gas, the exposure device further comprising:

a plurality of temperature sensors being arranged corresponding to the aperture member and the first and second spatial light modulators, respectively, the temperature sensors for detecting temperatures thereof, and a valve controller for controlling the valve of each of the nozzles, based on the detected temperatures.

9. The exposure device according to claim 2, further comprising a plurality of nozzles for blowing coolant gas to the aperture member and the first and second spatial light modulators, separately.

10. The exposure device according to claim 9, wherein each of the nozzles has a valve for adjusting an amount of the coolant gas, the exposure device further comprising:

a plurality of temperature sensors being arranged corresponding to the aperture member and the first and second spatial light modulators, respectively, the temperature sensors for detecting temperatures thereof, and a valve controller for controlling the valve of each of the nozzles, based on the detected temperatures.

11. The exposure device according to claim 1, wherein the aperture member further has third and fourth rectangular windows, the aperture member for further producing third and fourth light beams based on the ray from the first lighting system by using the third and fourth rectangular windows, the exposure device further comprising third and fourth spatial light modulators for spatially modulating the third and fourth light beams produced by the aperture member, respectively, wherein the first, second, third and fourth rectangular windows of the aperture member are positioned at 45, 135, 225 and 315 degree, respectively with respect to a line of one of the rectangular windows.

12. The exposure device according to claim 1, further comprising an optical filter in the first lighting system, a passing wavelength range of which is variable.

13. The exposure device according to claim 12, wherein the optical filter comprises a combination of filter elements which have different passing wavelength ranges, and the passing wavelength range of the optical filter is varied by changing the combination of the filter elements.

14. An exposure device for forming predetermined patterns onto an object, comprising:

first and second optical sources for emitting UV rays;

first and second lighting systems for shaping the UV rays from the first and second light sources into collimated light beams, respectively;

a first aperture member having four rectangular windows, the first aperture member for splitting the light beam from the first lighting system into four light beams by using the rectangular windows;

a second aperture member having four rectangular windows, the second aperture member for splitting the light beam from the second lighting system into four light beams by using the rectangular windows;

first to fourth spatial light modulators for spatially modulating the four light beams split by the first aperture member, respectively;

fifth to eighth spatial light modulators for spatially modulating the four light beams split by the second aperture member, respectively;

first to eighth projection lighting systems for guiding the light beams modulated by the first to eighth spatial light modulators to the object, respectively; and a substrate stage on which the object is to be placed, the substrate stage for moving the object in predetermined directions, wherein the object is positioned at focal points of the first to eighth projection lighting systems.

15. The exposure device according to claim 14, further comprising:

first to eighth reflective optical elements for totally reflecting the light beams that have been split by the first and second aperture members, thereby directing the reflected light beams toward the first to eighth spatial light modulators, respectively; and a plurality of second lighting systems for guiding the light beams reflected by the first to eighth reflective optical elements to the first to eighth spatial light modulators, respectively, all optical paths of the second lighting systems being not equal, wherein the first to eighth projection lighting systems are arrayed.

16. The exposure device according to claim 15, further comprising one or more total reflection mirrors that are placed between the first and second aperture members and the first to eighth spatial light modulators.

17. The exposure device according to claim 16, further comprising a plurality of nozzles for blowing coolant gas to the first and second aperture members and the first to eighth spatial light modulators, separately.

18. The exposure device according to claim 15, wherein each of the second lighting systems comprises an iris adjuster having a variable opening window, and the iris adjuster changes size of the opening window, thereby adjusting intensity of the light beam incident thereon, and wherein the iris adjuster has a heatsink member.

19. The exposure device according to claim 18, further comprising a plurality of nozzles for blowing coolant gas to the first and second aperture members and the first to eighth spatial light modulators, separately.

20. The exposure device according to claim 15, further comprising a plurality of nozzles for blowing coolant gas to the first and second aperture members and the first to eighth spatial light modulators, separately.

* * * * *